US011257970B2

United States Patent
Choi et al.

(10) Patent No.: US 11,257,970 B2
(45) Date of Patent: Feb. 22, 2022

(54) SOLAR CELL MODULE

(71) Applicant: LG ELECTRONICS INC., Seoul (KR)

(72) Inventors: Yoonsuk Choi, Seoul (KR); Joongtae Kim, Seoul (KR); Juhwan Yun, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/993,201

(22) Filed: May 30, 2018

(65) Prior Publication Data

US 2018/0351018 A1 Dec. 6, 2018

(30) Foreign Application Priority Data

May 31, 2017 (KR) ........................ 10-2017-0067570

(51) Int. Cl.
| | | |
|---|---|---|
| *H01L 31/048* | (2014.01) | |
| *H02S 40/34* | (2014.01) | |
| *H01L 31/02* | (2006.01) | |
| *H02S 30/10* | (2014.01) | |
| *H02S 40/32* | (2014.01) | |

(52) U.S. Cl.
CPC ...... *H01L 31/048* (2013.01); *H01L 31/02013* (2013.01); *H01L 31/02021* (2013.01); *H02S 30/10* (2014.12); *H02S 40/32* (2014.12); *H02S 40/34* (2014.12)

(58) Field of Classification Search
None
See application file for complete search history.

(56) References Cited

U.S. PATENT DOCUMENTS

| | | | | |
|---|---|---|---|---|
| 7,002,813 B2* | 2/2006 | Bergmann | ........ | H01L 31/02013 29/739 |
| 7,880,098 B2* | 2/2011 | Grimberg | ............. | H01R 13/502 136/251 |
| 2008/0314434 A1* | 12/2008 | Khouri | .................... | H02S 30/20 136/245 |
| 2010/0182761 A1* | 7/2010 | Suzuki | .................. | H02S 40/345 361/807 |

(Continued)

FOREIGN PATENT DOCUMENTS

| | | |
|---|---|---|
| CN | 203387466 U | 1/2014 |
| EP | 3151357 A1 | 4/2017 |

(Continued)

OTHER PUBLICATIONS

Machine translation of H11251614A, Sep. 17, 1999 (Year: 1999).*

*Primary Examiner* — Tamir Ayad
(74) *Attorney, Agent, or Firm* — Birch, Stewart, Kolasch & Birch, LLP

(57) ABSTRACT

Disclosed is a solar cell panel module including a solar cell panel; a wiring enclosure electrically connected to the solar cell panel and mounted on or at a back surface of the solar cell panel; and an adhesive member disposed between the wiring enclosure and the solar cell panel to attach the wiring enclosure and the solar cell panel. An air gap opened to an outside and having a thickness corresponding to a thickness of the adhesive member is provided between the solar cell panel and the wiring enclosure by the adhesive member.

17 Claims, 12 Drawing Sheets

(56) References Cited

U.S. PATENT DOCUMENTS

| | | | |
|---|---|---|---|
| 2013/0092216 A1* | 4/2013 | Yan | H02S 40/34 |
| | | | 136/251 |
| 2013/0178083 A1* | 7/2013 | Ohmori | H02G 3/16 |
| | | | 439/188 |
| 2014/0293553 A1 | 10/2014 | Stanelli et al. | |
| 2015/0021310 A1* | 1/2015 | Van Straten | H02S 40/12 |
| | | | 219/213 |
| 2015/0038005 A1 | 2/2015 | Ji | |
| 2016/0156306 A1 | 6/2016 | Mariotto et al. | |

FOREIGN PATENT DOCUMENTS

| | | |
|---|---|---|
| JP | JR 11-251614 A | 9/1999 |
| JP | 2004-522324 A | 7/2004 |
| JP | 2007-115915 A | 5/2007 |
| JP | 2010-524244 A | 7/2010 |
| JP | 2010-263071 A | 11/2010 |
| JP | 2014-522627 A | 9/2014 |
| JP | 2015-133902 A | 7/2015 |
| KR | 10-2015-0133594 A | 11/2015 |
| WO | WO 2005/117141 A1 | 12/2005 |
| WO | WO 2009/011051 A1 | 1/2009 |
| WO | WO 2011/132748 A1 | 10/2011 |

* cited by examiner

SOLAR CELL MODULE

CROSS-REFERENCE TO RELATED APPLICATION

This application claims priority to and the benefit of Korean Patent Application No. 10-2017-0067570, filed in the Korean Intellectual Property Office on May 31, 2017, the entire contents of which are incorporated herein by reference.

BACKGROUND OF THE INVENTION

Field of the Invention

Embodiments of the invention relate to a solar cell module, and, more particularly, to a solar cell module having an improved structure.

Description of the Related Art

Recently, as energy resources such as oil and coal are expected to be depleted, interest in alternative energy to replace them is increasing. Among them, solar cells are attracting attention as a next generation battery which converts solar energy into electric energy. Since a solar cell is exposed to an external environment for a long time, it is manufactured in a form of a solar cell module by a packaging process for protecting the solar cell.

A solar cell module includes a solar cell panel including a solar cell, and a wiring box having members, circuits, and the like connected to the solar cell panel. Conventionally, in consideration of a sealing property and structural stability, the wiring box is entirely fixed or adhered to the solar cell panel so that a path through which air flows is not provided between the solar cell panel and the wiring box. According to this, since heat generated by the wiring box is not smoothly discharged during an operation of the solar cell panel, the heat may be concentrated in a portion where the wiring box is positioned. Thus, output and efficiency of the solar cell module may be lowered due to a temperature increase. In order to prevent this, a structure in which a wiring box is separated from a solar cell panel by using a separate structural member has been suggested. However, due to the separate structural member, a process may be complicated, a cost may be increased, and fixing stability of the wiring box may be deteriorated. Alternatively, a structure has been proposed in which a recess portion, a protruding portion, or the like is formed at a mounting surface of a wiring box to separate a part of the wiring box from a solar cell panel. Such a recess portion, a protruding portion, or the like may undesirably affect members, circuits, and the like provided in the wiring box, and heat radiation effect may be not excellent because a part of the wiring box is still in contact with the solar cell panel.

SUMMARY OF THE INVENTION

Therefore, embodiments of the invention have been made in view of the above problems, and embodiments of the invention are to provide a solar cell module having improved output and reliability by enhancing heat radiation effect.

A solar cell module according to an embodiment of the invention includes a solar cell panel; a wiring enclosure electrically connected to the solar cell panel and mounted on or at a back surface of the solar cell panel; and an adhesive member disposed between the wiring enclosure and the solar cell panel to attach the wiring enclosure and the solar cell panel. An air gap opened to an outside and having a thickness corresponding to a thickness of the adhesive member is provided between the solar cell panel and the wiring enclosure by the adhesive member.

According to an embodiment, convection cooling is performed between a solar cell panel and a wiring enclosure using an air gap opened to an outside when a solar cell module is operated. Thus, temperature at a portion where the wiring enclosure is positioned can be prevented from increasing. Accordingly, output and efficiency of the solar cell module can be prevented from being lowered due to heat generated by the wiring enclosure, and thus, output and reliability of the solar cell module can be improved. In this instance, the air gap opened to the outside can be formed by a simple structure using an adhesive member for attaching the wiring enclosure. Thus, compared with the conventional case of using a separate structure or forming a recess portion, a protruding portion, or the like at a wiring enclosure, design freedom and stability can be improved, a manufacturing process can be simplified, and a manufacturing cost can be reduced.

DETAILED DESCRIPTION OF THE EMBODIMENTS

Figure 1:
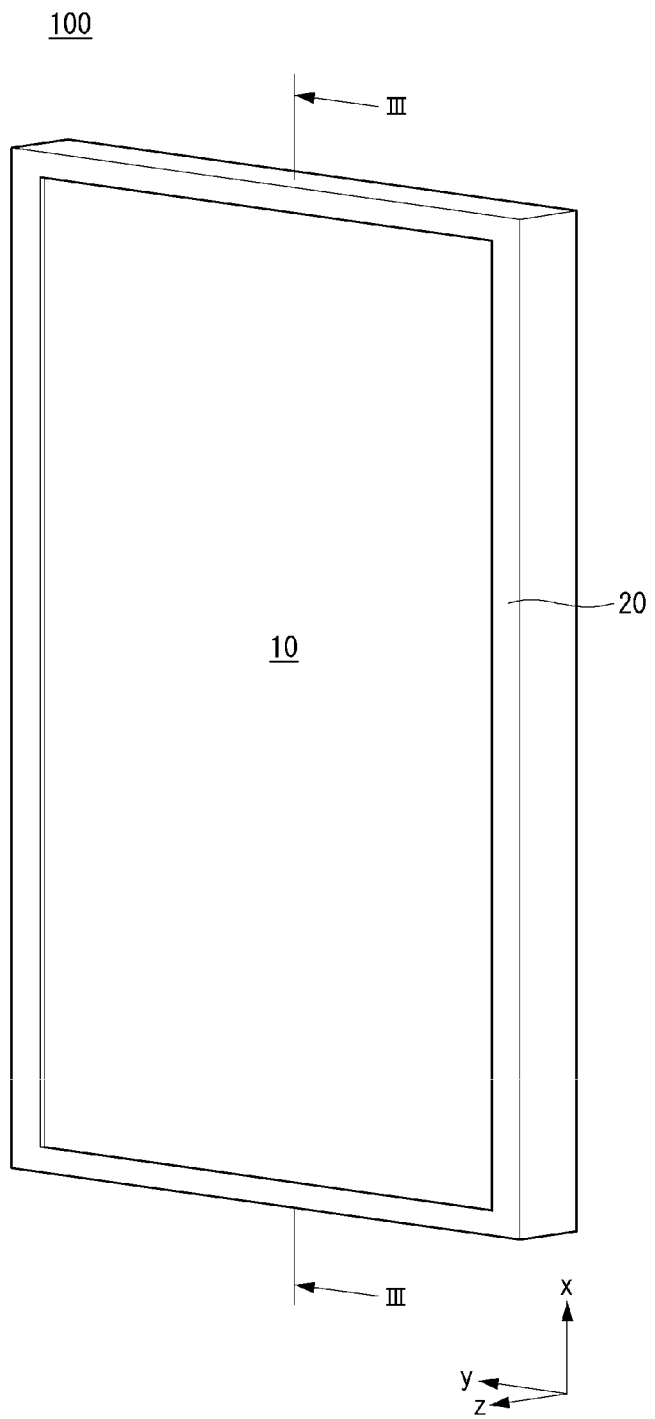
FIG. 1 is a front perspective view showing a solar cell module according to an embodiment of the invention.

Reference will now be made in detail to various embodiments of the invention, examples of which are illustrated in accompanying drawings. The invention may, however, be embodied in many alternate forms and should not be construed as limited to the embodiments set forth herein.

In the drawings, illustration of parts unrelated to embodiments of the invention is omitted for clarity and simplicity of description. The same reference numerals designate the same or very similar elements throughout the specification. In the drawings, thicknesses, widths or the like of elements are exaggerated or reduced for clarity of description, and should not be construed as limited to those illustrated in the drawings.

It will be understood that the terms "comprise" and/or "comprising," or "include" and/or "including" used in the specification specify the presence of stated elements, but do not preclude the presence or addition of one or more other elements. In addition, it will be understood that, when an element such as a layer, film, region, or plate is referred to as being "on" another element, it may be directly disposed on another element or may be disposed such that an intervening element is also present therebetween. Accordingly, when an element such as a layer, film, region, or plate is disposed "directly on" another element, this means that there is no intervening element between the elements.

Hereinafter, a solar cell module according to an embodiment of the invention will be described in detail with reference to the accompanying drawings.

Figure 2:
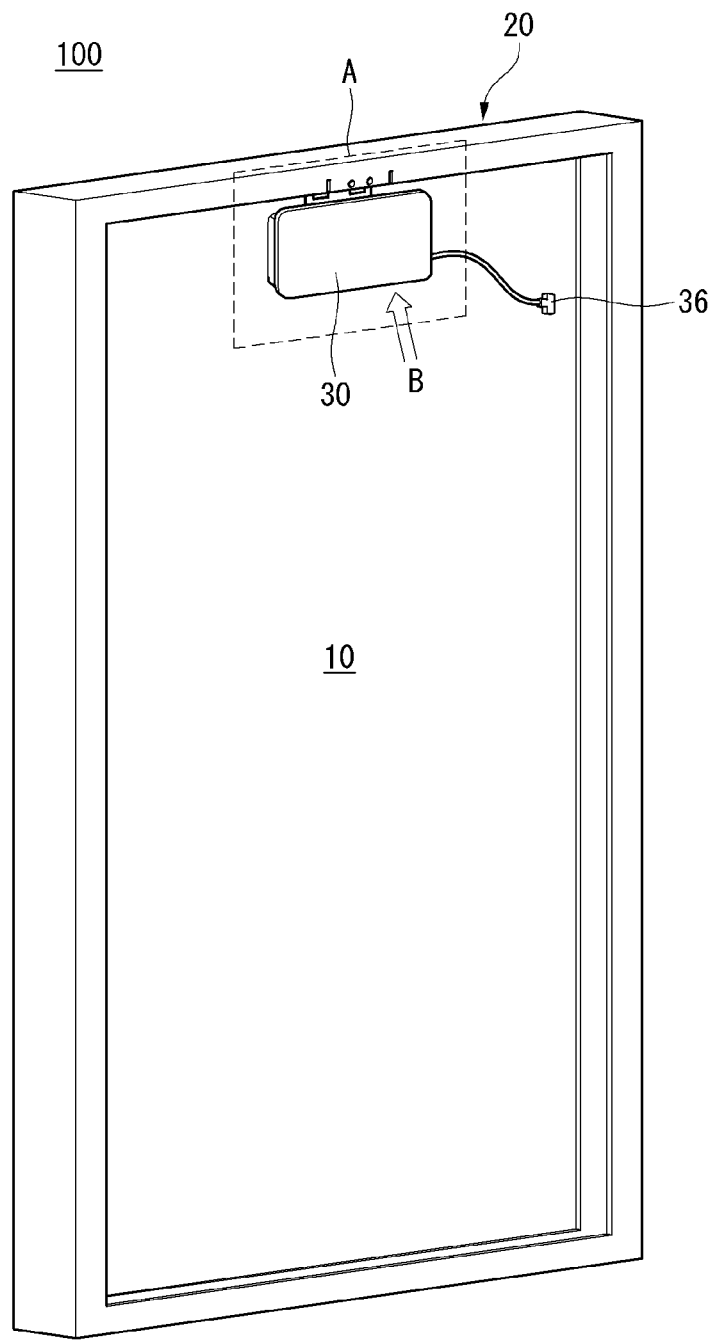
FIG. 2 is a rear perspective view of the solar cell module shown in FIG. 1.
Figure 3:
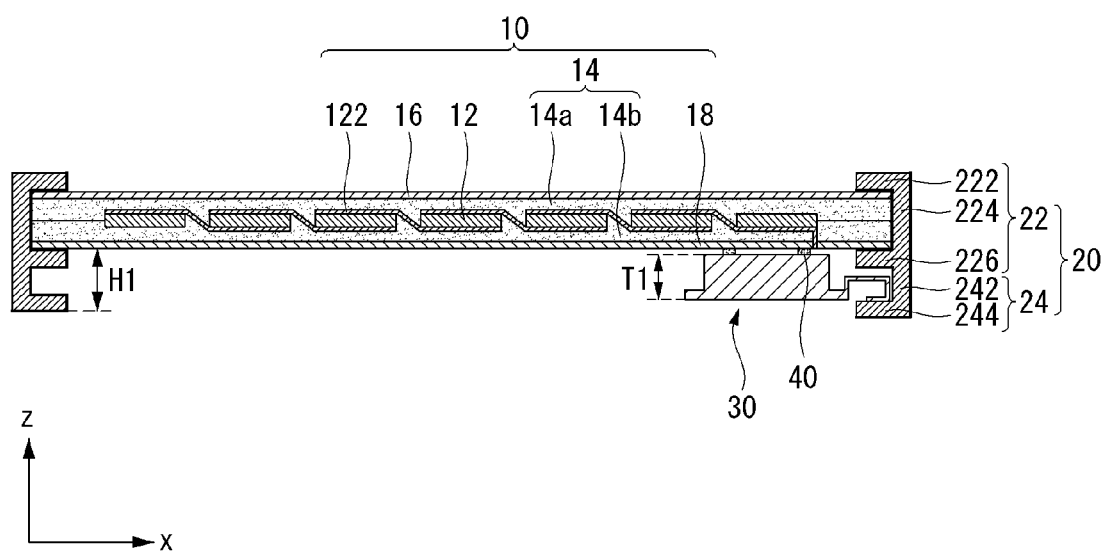
FIG. 3 is a schematic cross-sectional view taken along a line III-III in FIG. 1.

FIG. 1 is a front perspective view showing a solar cell module 100 according to an embodiment of the invention, and FIG. 2 is a rear perspective view of the solar cell module 100 shown in FIG. 1. FIG. 3 is a schematic cross-sectional view taken along a line III-III in FIG. 1. For reference, a wiring box 30 (or wiring enclosure or wiring cover) is schematically shown in FIG. 3, and the wiring box 30 will be described later in more detail with reference to FIGS. 4 to 7.

Referring to FIGS. 1 to 3, a solar cell module 100 according to the embodiment includes a solar cell panel 10 including a solar cell 12, a wiring box 30 electrically connected to the solar cell panel 10 and mounted on or at a back surface of the solar cell panel 10, and an adhesive member 40 disposed between the wiring box 30 and the solar cell panel 10 to attach the wiring box 30 and the solar cell panel 10. An air gap opened to an outside and having a thickness corresponding to a thickness of the adhesive member 40 is provided between the solar cell panel 10 and the wiring box 30 by the adhesive member 40. The solar cell module 100 may further include a frame 20 for fixing an outer peripheral portion of the solar cell panel 10. A sealing member for sealing and adhering the solar cell 10 and the frame 20 may be positioned between the solar cell panel 10 and the frame 20.

According to the embodiment, the solar cell panel 10 includes at least a solar cell 12, and may include a front member (a front covering member) 16 positioned on a front surface of the solar cell 12, a back member (a back covering member) 18 positioned on a back surface of the solar cell 12, and a sealing member 14 disposed between the front member 16 and the back member 18 and covering and surrounding the solar cell 12.

In one example, the solar cells 12 may include a semiconductor substrate (for example, a single-crystalline semiconductor substrate, more particularly, a single-crystalline silicon wafer), first and second conductive regions having opposite conductivity types and formed on or at the semiconductor substrate, and first and second electrodes connected respectively to the first and second conductive regions. In this instance, the semiconductor substrate may have a p-type or n-type dopant with a low doping concentration, and one of the first and second conductive regions may have a p-type dopant and the other one of the first and second conductive regions may have an n-type dopant. The first or second conductive region may be a doped region formed by doping a portion of the semiconductor substrate with a dopant, or may be a semiconductor layer separately formed on the semiconductor substrate and doped with a dopant. In addition, the solar cell 12 may include a plurality of solar cells 12. A plurality of solar cells 12 may form a solar cell string constituting one line or one column in such a way that the first electrode of one solar cell 12 is connected to the second electrode of another neighboring solar cell 12 by a conductive connecting member 122 or the like. Any of various other known structures may be applied to a structure of the solar cell 12, a connection structure of the solar cells 12, or the like. As the conductive connecting member 122, any of various members such as a ribbon, an interconnector, or the like may be applied. One solar cell string or a plurality of solar cell strings may be included in the solar cell panel 10.

As described above, it is exemplified that the solar cell 12 is a silicon semiconductor solar cell in the embodiment. However, embodiments of the invention are not limited thereto and a solar cell 12 may be selected from various other structures of solar cells, such as, a thin film solar cell, a dye-sensitive solar cell, a tandem solar cell, a composite semiconductor solar cell, or the like. In addition, although it is exemplified that the plurality of solar cells 12 are included in the embodiment, only one solar cell 12 may be included.

The front member 16 is disposed on the sealing member 14 (a first sealing member 14a) to constitute a front surface of the solar cell panel 10 and the back member 18 is disposed on the sealing member 14 (a second sealing member 14b) to constitute a back surface of the solar cell panel 10. The front member 16 and the back member 18 protect the solar cell 12 at the front and back surfaces of the solar cell 12 by a waterproof property, an insulating property and a ultraviolet shielding property.

For example, the front member 16 may be a glass substrate having excellent durability, insulation property, moisture-proof property, light transmittance, and the like. The back member 18 may have a form of a film or a sheet. For example, the back member 18 may include a base member and a resin layer formed on at least one surface of the base member. For example, the back member 18 may be a Tedlar/PET/Tedlar (TPT) type, or may be formed of a polyvinylidene fluoride (PVDF) resin formed on at least one surface of polyethyleneterephthlate (PET). Poly vinylidene fluoride is a polymer having a structure of $(CH_2CF_2)n$ and has double fluorine bonds, thereby exhibiting excellent mechanical properties, weather-resistance and ultraviolet-resistance. However, embodiments of the invention are not limited to materials of the back member 18.

The sealing member 14 prevents moisture and oxygen from flowing into the solar cell 12 and chemically combines elements of the solar cell 10. The sealing member 14 may include an insulating material having translucency and adhesiveness as a base material. The term of "a base material" means a material contained with the most weight percentage (wt %) in each layer. For example, the sealing member 14 may include at least one of an ethylene vinyl acetate (EVA) resin, a polyvinyl butyral, a silicone resin, an ester resin, an olefin resin, a polyethylene resin, an ionomer, and the like.

To stably fix the solar cell panel 10 having the above layers, a frame 20 for fixing an outer peripheral portion of the solar cell panel 10 may be included. The frame 20 may be formed along edges of the solar cell panel 10, and then, the outer peripheral portions of the solar cell panel 10 can be protected by the frame 20.

In the embodiment, the frame 20 may include a panel-inserted portion 22 into which at least a part of the solar cell panel 10 is inserted, and an extension portion 24 extending outward from the panel-inserted portion 22. The extension portion 24 is a portion that increases strength of the frame 20 and is fixed to a rack, a supporter, a ground, or the like. By the panel-inserted portion 22 and the extension portion 24, the solar cell panel 10 can be prevented from being damaged when the solar cell module 100 is installed.

More specifically, the panel-inserted portion 22 may include a front portion 222 positioned at a front surface of the solar cell panel 10, a lateral portion 224 positioned at a lateral surface of the solar cell panel 10, and a back portion 226 positioned at a back surface of the solar cell panel 10. The front portion 222, the lateral portion 224, and the back portion 226 of the panel-inserted portion 22 may be connected to one another to define a space into which the outer peripheral portion of the solar cell panel 10 is inserted. In one example, the panel-inserted portion 22 may be bent two times to have a "U"-shaped cross-section such that an edge of the solar cell panel 10 is positioned inside the panel-inserted portion 22. However, embodiments of the invention are not limited thereto, and any one of the front portion 222, the lateral portion 224, and the back portion 226 may be omitted or a part of the front portion 222, the lateral portion 224, or the back portion 226 may be partially removed. Various other modifications are also possible.

The extension portion 24, extending rearward from the panel-inserted portion 22, may include a first portion 242, which extends rearward from the panel-inserted portion 22 to be parallel to the lateral portion 224 (or to be positioned in the same plane as the lateral portion 224), and a second portion 244, which is bent inward from the first portion 242 and to be spaced from the back surface of the solar cell panel 10 or the back portion 226 by a constant distance. The second portion 244 may be parallel to or inclined from the back surface of the solar cell panel 10 or the back portion 226. As such, the extension portion 24 may be bent one time to have an "L"-shaped cross-section to define a space between the panel-inserted portion 22 and the extension portion 24.

The wiring box 30 positioned at or on the back surface of the solar cell panel 10 and electrically connected to the solar cell 12 may include various elements, members, circuits, or the like for transmitting electric energy generated by the solar cell panel 10 to an outside. The wiring box 30 may be attached by an adhesive member 40.

In one example, the wiring box 30 may be disposed on the back surface of the solar cell panel 10 to be close to an upper end portion of the solar cell panel 10. In this instance, a sum of a thickness T1 of the wiring box 30 and a thickness of the adhesive member 40, which attaches the wiring box 30 to the solar cell panel 10, may be less than a height H1 of the extension portion 24 of the frame 20 (more particularly, a height of the first portion 242). Here, the height H1 of the extension portion 24 may be defined as a distance from the back surface of the solar cell panel 10 to an outer surface of the second portion 244 of the extension portion 24. As such, the wiring box 30 may not protrude than the outer surface of the second portion 244. That is, a back surface of the wiring box 30 (i.e. a surface of the wiring box 30 far from the solar cell panel 10) may be positioned in the same plane as the outer surface of the second portion 244 or may be positioned closer to the solar cell panel 10 than the outer surface of the second portion 244. Thereby, a volume of the solar cell module 100 can be minimized and a space at a back side of the solar cell panel 10 can be efficiently utilized.

In this instance, in the embodiment, a part of the wiring box 30 may be positioned inside the space formed by the extension portion 24 of the frame 20 adjacent to the upper end portion of the solar cell panel 10 and be coupled to the extension portion 24. In this instance, in a portion of the wiring box 30 positioned inside the space formed by the extension portion 24, the back surface of the wiring box 30 may be positioned on the same plane as an inner surface of the second portion 244 or closer to the solar cell panel 10 than the inner surface of the second portion 244. Then, a part of the wiring box 30 can be easily positioned inside the space formed by the extension portion 24. This will be described in more detail later.

As described above, in the embodiment, the wiring box 30 is attached and fixed to the solar cell panel 10 by the adhesive member 40. In the embodiment, the adhesive member 40 also forms an air gap G that is opened to an outside between the wiring box 30 and the solar cell panel 10. This will be described in detail with reference to FIG. 4.

Figure 4:
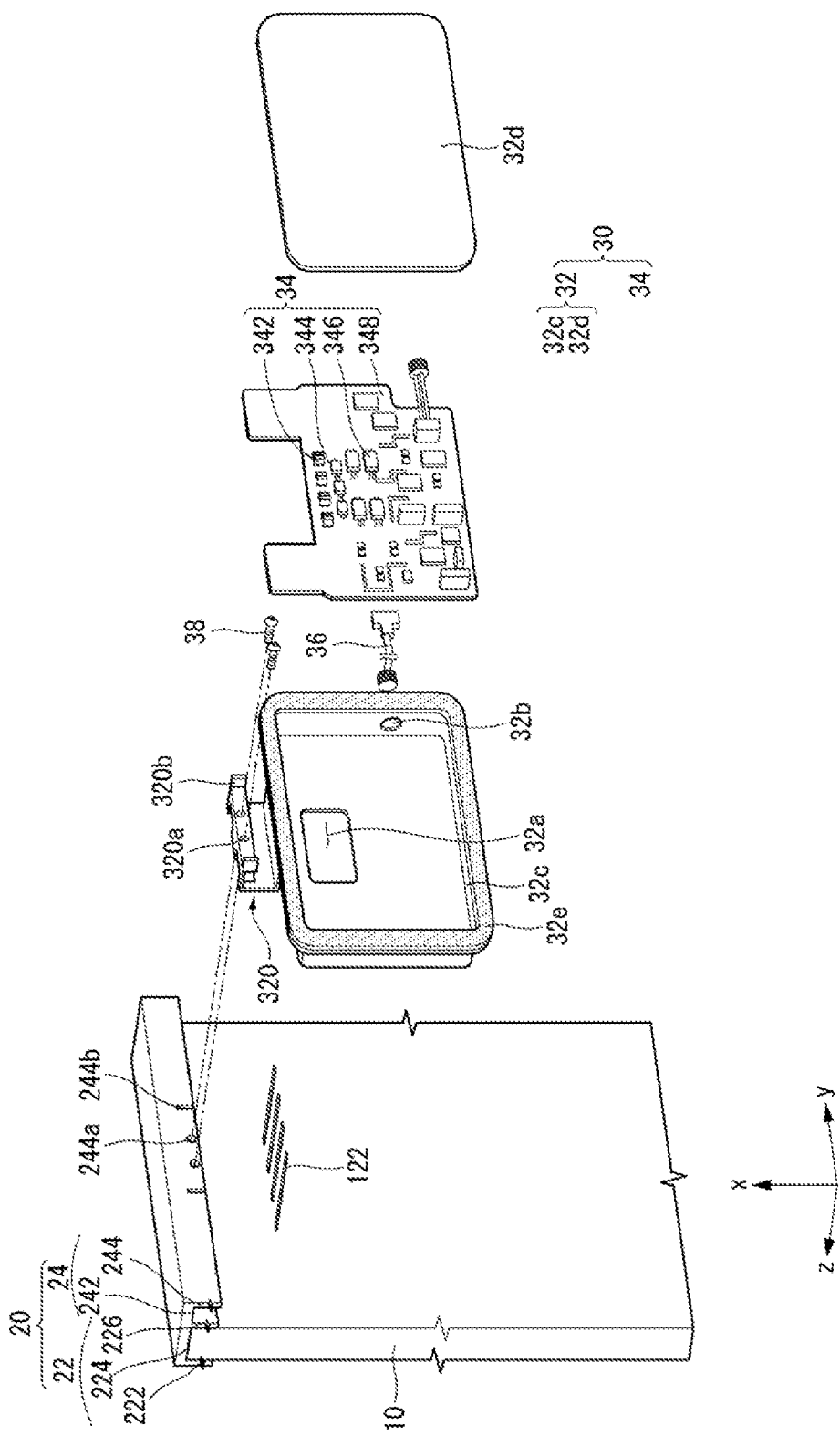
FIG. 4 is an enlarged exploded perspective view showing a portion A in FIG. 2.
Figure 5:
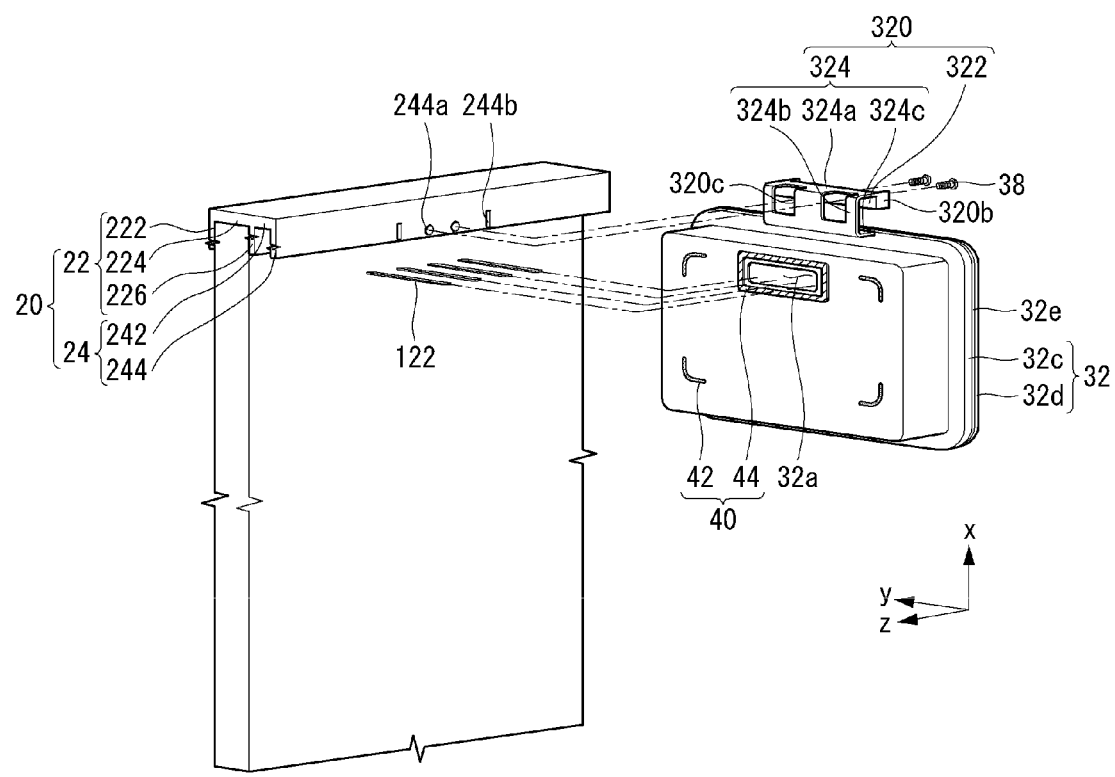
FIG. 5 is an enlarged exploded perspective view showing the portion A in FIG. 2 in which a wiring box is separated from a solar cell panel and is rotated so that a front surface of a wiring box facing a solar cell panel is shown.
Figure 6:
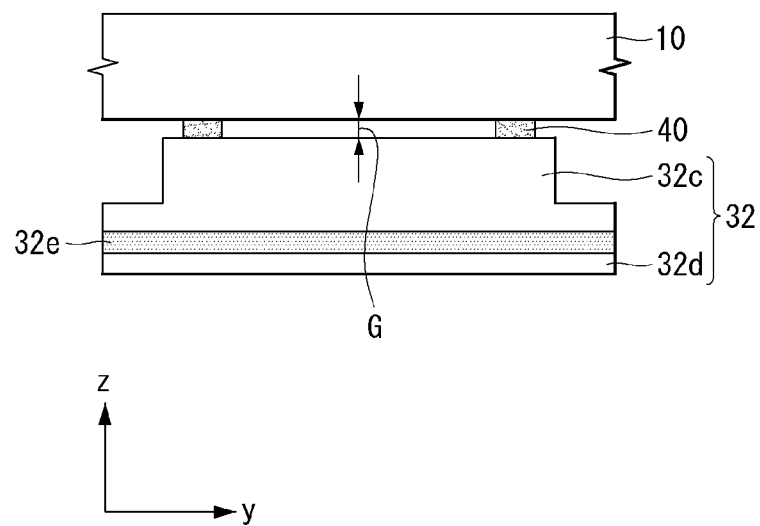
FIG. 6 is a schematic partial side view showing a solar cell panel, the wiring box, and an adhesive member as viewed in a direction B in FIG. 2.
Figure 7:
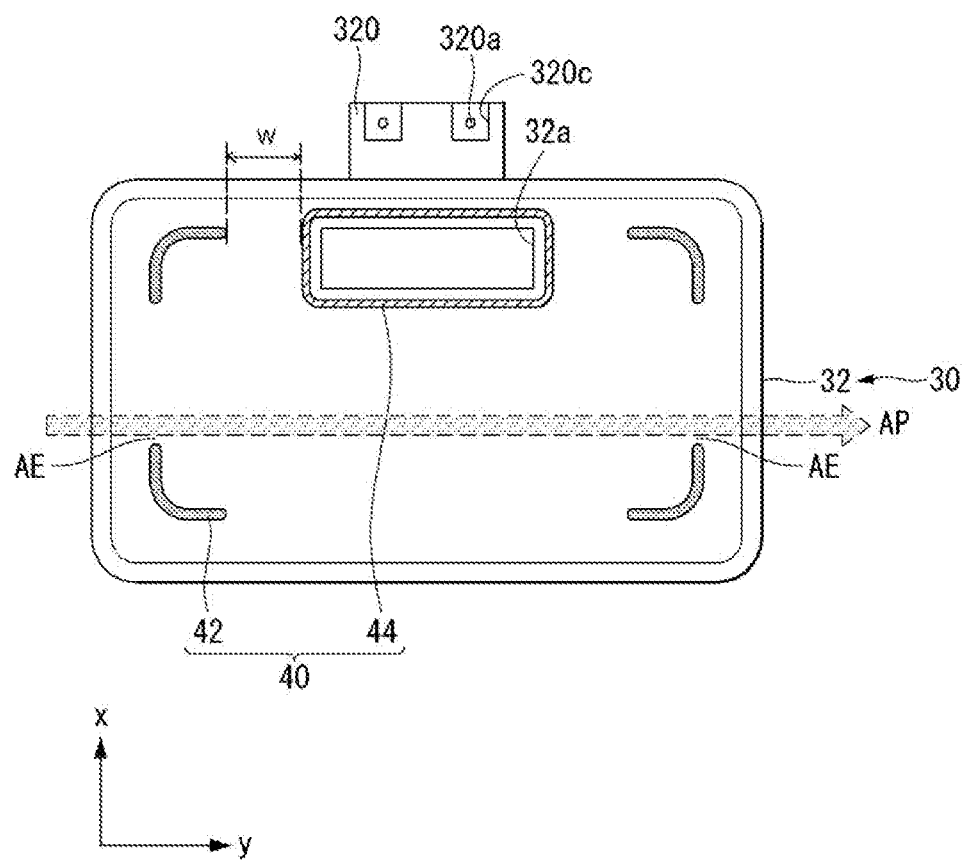
FIG. 7 is a plan view schematically showing the wiring box and the adhesive member included in the solar cell module shown FIG. 1.

FIG. 4 is an enlarged exploded perspective view showing a portion A in FIG. 2, and FIG. 5 is an enlarged exploded perspective view showing the portion A in FIG. 2 in which the wiring box 30 is separated from the solar cell panel 10 and is rotated so that a front surface of the wiring box 30 facing the solar cell panel 10 is shown. FIG. 6 is a schematic partial side view showing the solar cell panel 10, the wiring box 30, and the adhesive member 40 as viewed in a direction B in FIG. 2. FIG. 7 is a plan view schematically showing the wiring box 30 and the adhesive member 40 included in the solar cell module 100 shown FIG. 1. For reference, for simplicity, the front surface of the wiring box 30 facing the solar cell panel 10 is shown in FIG. 7, but a circuit portion 34 positioned inside a case 32 is not shown in FIG. 7.

In the embodiment, the wiring box 30 may include a case 32 having an inner space and a circuit portion 34 positioned inside the case 32.

In the drawings, the case 32 may include first and second case portions 32c and 32d. In a state where the first case portion 32c and the second case portion 32d are separated from each other, the circuit portion 34 can be inserted or pulled out. In a state where the first case portion 32c and second case portion 32d are combined, the circuit portion 34 can be stably accommodated in the inner space. The first and second case portions 32c and 32d may be adhered or attached to each other by a bonding portion 32e positioned between the first and second case portions 32c and 32d at a portion (for example, a flange portion) where the first and second case portions 32c and 32d are adjacent to each other. Then, the inner space of the case 32 can be sealed to maintain stable sealing. However, embodiments of the invention are not limited thereto. Therefore, the first and second case portions 32c and 32d may be fixed to each other by a fastening member or may be fixed by using a fastening member together with the adhesive portion 32e. The first and second case portions 32c and 32d may be fixed by any of various other methods.

The circuit portion 34 may include at least one of a terminal 342, a bypass diode 344, an inverter member 346, and a circuit board 348. The conductive connecting member 122 may be connected to the terminal 342 so that the terminal 342 receives electric energy generated by the solar cell panel 10. The bypass diode 344 provides a bypass path in a case that some of the solar cells 12 do not operate. The inverter member 346 converts a direct current (DC) voltage to an alternating current (AC) voltage or convert a direct or alternating current voltage to another direct or alternating current voltage having a different value. In particular, the inverter member 346 may include a DC-AC inverter that converts a DC voltage generated by the solar cell panel 10 to an AC voltage. Various elements, members, or circuits (e.g., the terminals 342, the bypass diodes 344, the inverter member 346, etc.) positioned inside the wiring box 30 may be fixed to the circuit board 348, and/or may be electrically connected to each other by the circuit board 348.

In the embodiment, the wiring box 30 is integrated so as to include at least a part of the conventional junction box and at least a part of the conventional inverter (for example, a part of the conventional micro inverter). It is exemplified that all of the terminal 342, the bypass diode 344, the inverter member 346, and the circuit board 348 are provided as an example. That is, the wiring box 30 according to the embodiment may be named as a junction-box-integrated wiring box, a bypass-diode-integrated wiring box, an integral junction box, an inverter-integrated junction box, or the like.

Accordingly, the wiring box 30 may include both of a structure for connection with the solar cell 12 and a structure for connection with an outside (for example, another solar cell module 100 or an electrical grid). More particularly, the case 32 may have a first through hole 32a through which the conductive connecting member 122 passes to be connected to the solar cell 12, and a second through hole 32b through which a single alternating current output cable 36, which transmits an alternating current voltage generated by the wiring box 30 to an outside, passes. Thus, a structure and an installation process of the wiring box 30 can be simplified, and two direct current output cables for connecting a junction box and an inverter can be removed to prevent damage caused by the direct current output cables. Accordingly, a structure of the solar cell module 100 can be simplified and stability of the solar cell module 100 can be improved.

However, embodiments of the invention are not limited thereto. Thus, the wiring box 30 of the embodiment may serve only as at least part of a junction box including a terminal or a bypass diode, or may perform only at least part of an inverter or a micro inverter including an inverter member.

In the embodiment, the wiring box 30 is attached and fixed to the solar cell panel 10 by the adhesive member 40. In this instance, the wiring box 30 is attached or fixed to the solar cell panel so that an air gap G, which has a certain thickness or distance and is opened to an outside, is provided between the solar cell panel 10 and the wiring box 30. The term of "the air gap G opened to the outside" means that the air gap G between the wiring box 30 and the solar cell panel 10 is communicated with the outside of the wiring box 30. That is, it means that the air gap G has a structure in which air positioned at an outer portion except for a space between the solar cell panel 10 and the wiring box 30 flows into the space between the solar cell panel 10 and the wiring box 30 or in which air positioned at the space between the solar cell panel 10 and the wiring box 30 flows out to the outer portion except for the space between the solar cell panel 10 and the wiring box 30. For example, the adhesive member 40 may have an open-curve shape or an open-loop shape between the wiring box 30 and the solar cell panel 10.

More specifically, the air gap G for forming an air flow path AP communicating with the outside is formed by the adhesive member 40 positioned between the wiring box 30 and the solar cell panel 10. The air gap G may have a thickness corresponding to a thickness of the adhesive member 40. Here, the phrase of "the air gap G has the thickness corresponding to the thickness of the adhesive member 40" means not only the case where the adhesive member 40 has the same thickness as the adhesive member 40 but also the case where the air gap G has the thickness regarded as the substantially same as the thickness of the adhesive member 40 (that is, the case where the difference between the thickness of the air gap G and the thickness of the adhesive member 40 is not great (for example, is not beyond an error tolerance) although the thickness of the adhesive member 40 is different from the thickness of the adhesive member 40).

More specifically, the adhesive member 40 may include a plurality of adhesive members 40 spaced apart from each other, and thus, the air flow path AP may include at least two air entrances AE through which air flows in or out between the solar cell panel 10 and the wiring box 30. At least one of the at least two air entrances AE acts as an inlet through which the outside air flows in and at least another one of the air entrances AE acts as an outlet through which air flows out. In this instance, it is not determined that which air entrance AE acts as the inlet or the outlet, and thus, one air entrance AE may act as an inlet in some cases and an outlet in some other cases. Further, the air entrance AE may act as both of an inlet and an outlet at the same time.

The adhesive member 40 may be formed of any of various materials having an excellent adhesive property to stably fix the solar cell panel 10 and the wiring box 30. For example, a sealant or the like formed of an adhesive material may be used as the adhesive member 40. As an example, a silicone-resin-based sealant including a silicone resin may be used as the adhesive member 40. In the embodiment, the adhesive member 40 may include a first adhesive member 42 and a second adhesive member 44. The first adhesive member 42 and the second adhesive member 44 may be formed of the same material or may be formed of different materials. For example, the second adhesive member 44 is formed of a sealant having a waterproof property superior to that of the first adhesive member 42. Then, the second adhesive member 44 stably seals the first through hole 32a. However, embodiments of the invention are not limited thereto. The first and second adhesive members 42 and 44 will be described later in more detail.

The adhesive member 40 may be applied to the back surface of the solar cell panel 10 or the front surface of the wiring box 30, and then, the solar cell panel 10 and the wiring box 30 may be in close contact with each other by applying a force to fix the solar cell panel 10 and the wiring box 30. Then, a material cost can be reduced, a manufacturing process can be simplified, and an adhesive property and a sealing property of the adhesive member 40 can be improved.

In this instance, even if a force is applied to the solar cell panel 10 and the wiring box 30, the adhesive member 40 is remained while having a constant thickness, and thus, the wiring box 30 and the solar cell panel 10 are spaced apart from each other. Accordingly, a space between the wiring box 30 and the solar cell panel 10 forms the air gap G. In this instance, a thickness of the adhesive member 40 or a thickness (or a height) of the air gap G may be 0.1 mm or more. If the thickness of the air gap G is less than 0.1 mm, effect by the air gap G may not be sufficiently achieved. Considering the effect of the air gap G, the thickness of the air gap G may be 0.5 mm or more. As described above, the thickness of the air gap G is smaller than the height H1 of the extension portion 24 (in FIG. 3), for example, the thickness of the air gap G may be in a range of 10 mm or less. In this instance, the thickness of the air gap G or the adhesive member 40 may be 5 mm or less (as an example, 3 mm or less), considering that a material cost, fixing stability, and the like may be lowered as the thickness of the adhesive member 40 becomes thick. However, embodiments of the invention are not limited thereto.

When the air gap G is formed by the adhesive member 40 as described above, the wiring box 30 does not have a separate structure (for example, a recess portion, and/or a protruding portion) for forming the air gap G. Thus, the front surface of the wiring box 30 facing the solar cell panel 10 may be formed of a flat surface without being bent or without a recess portion, a protruding portion, or the like. According to this, the wiring box 30 can have a stable structure and the circuit portion 34 positioned in the wiring box 30 can be freely arranged without restriction. The adhesive member 40 can be applied without considering an alignment tolerance and the like, and thus, a manufacturing process can be simplified. If the front surface of the wiring box 30 has a bent portion, such as, a recess portion, a protruding portion, or the like, the bent portion has a height smaller than the thickness of the adhesive member 40 or the air gap G. Thus, the bent portion of the wiring box 30 does not affect to air flow through the air gap G. On the other hand, if a separate structure such as a recess portion, a protruding portion, or the like is formed on a front surface of a junction box, an inverter box, or so on as in the prior art, a shape and an arrangement of a circuit portion positioned inside the same must be changed, and a member for fixing a solar cell and a junction box, an inverter box, or so on, should be precisely aligned.

In this instance, a minimum width w of the air flow path AP (that is, a width between portions adjacent to each other among the plurality of adhesive members 40) may be larger than the thickness of the adhesive member 40 (that is, the thickness of the air gap G). For reference, it is exemplified that the air flow path AP has the minimum width w between the first adhesive member 42 and the second adhesive member 44 in FIG. 7. However, the minimum width w of the air flow path AP may be positioned at any of various positions. Thus, the air flow by the air flow path AP can be smoothly performed. A width of the adhesive member 40 may be greater than the thickness of the adhesive member 40. Thus, the solar cell panel 10 and the wiring box 30 can be stably fixed by the adhesive member 40. Since the solar cell panel 10 and the wiring box 30 are in close contact with each other by applying a force when the solar cell panel 10 and the wiring box 30 are fixed using the adhesive member 40, the thickness of the adhesive member 40 is reduced while the width of the member 40 is increased during the fixing or attaching process.

In the embodiment, a plurality of adhesive members 40 may include a plurality of first adhesive members 42, each having an open end, or may include a first adhesive member 42 having an open end and a second adhesive member 44 having a closed space in a plan view. Thus, a space between the first adhesive members 42 and/or a space between the first adhesive member 42 and the second adhesive member 44 acts as the air flow path AP through which air flows. On the other hand, in the prior art, one adhesive member is entirely and continuously extended along edges of a junction box, an inverter box, or so on to be connected entirely and to form only one closed space inside, and thus, the closed space formed by the adhesive member is kept separated from the outside without communicating with the outside.

In another embodiment, the solar panel module 100 may include a solar cell panel 10; a wiring box 30 electrically connected to the solar cell panel and attached on the solar cell panel 10; wherein a gap G is present between the wiring box 30 and a back surface of the solar cell panel 10. The gap G may correspond to a thickness of the adhesive member used to attach the wiring box 30 to the back surface of the solar cell panel.

In FIGS. 4 to 7, for example, it is exemplified that a plurality of first adhesive members 42 and a second adhesive member 44 are provided. According to this, the air flow paths AP are formed between the plurality of first adhesive members 42 and between the first adhesive members 42 and the second adhesive member 44 and thus the air can flow in a plurality of paths, thereby improving a heat dissipation property.

The second adhesive member 44 may have a structure that is continuously formed without disconnection so as to have a closed space therein. The second adhesive member 44 may be positioned so as to surround a portion of the wiring box 30 or the case 32 that needs to be sealed. For example, in the embodiment, the second adhesive member 44 may surround and seal the first through-hole 32a. That is, the second adhesive member 44 may have a closed space in a plan view, and the first through hole 32a may be positioned inside the closed space of the second adhesive member 44. The conductive connecting member 122 is positioned inside the case 32 by the first through hole 32a formed at the case 32 while an inner space and an outer space of the case 32 can be divided and separated by the second adhesive member 44. Thus, the case 32 having the first through-hole 32a can be stably sealed to have excellent airtightness, sealing and waterproof properties. Further, the case 32 is fixed to the solar cell panel 10 by the second adhesive member 44, and thus, fixing stability can be improved.

As an example, the second adhesive member 44 may have a shape such as a circular shape, a polygonal shape, or the like in a plan view. In the drawings, it is exemplified that the first through hole 32a has a substantially rectangular shape and the second adhesive member 44 has a substantially rectangular shape. However, embodiments of the invention are not limited thereto, and the second adhesive member 44 may have any of various structures and shapes being able to separate the first through hole 32a from the outside.

The first adhesive member 42 may have any of all structures not having a closed space therein, unlike the second adhesive member 44. The first adhesive member 42 may have any of various shapes such as a straight line, a curved line, an island, or the like having an open end. In this instance, an end of the first adhesive member 42 may have a curved portion or be rounded. Since the solar cell panel 10 and the wiring box 30 are in close contact with each other by applying a force after applying of the adhesive member 40 as described above, the adhesive member 40 is compressed in a thickness direction and is spread out in a planar direction (for example, a width direction and/or a length direction) so that the end of the first adhesive member 42 may have a curved portion or be rounded. According to this, the end of the first adhesive member 42 adjacent to the air entrance AE has a curved or rounded shape, not a pointed or sharp shape, and may not interfere with the air flow. However, embodiments of the invention are not limited thereto, and the end of the first adhesive member 42 may have a different shape.

In the embodiment, when the first through hole 32a is positioned at one side (an upper side of FIG. 7), the adhesive member 40 may be disposed so that the air flow path AP passes through at least the other side opposite to the one side, as shown by a dotted arrow in FIG. 7. In order to simplify a structure of the wiring box 30, the first through hole 32a may be positioned at the one side and the circuit portion 34 (particularly, the circuit board 348) may be positioned more at the other side. Then, since a large amount of heat may be generated by the circuit portion 34, at least one air flow path AP may be disposed so as to pass through the other side of the wiring box 30 (i.e., a portion where the circuit portion 34 is positioned) to improve dissipation property. For reference, it is exemplified that only one of the various air flow paths AP is illustrated by way of example in FIG. 7, and in practice, there are various air flow paths AP by the plurality of adhesive members 40.

The second adhesive member 44 surrounding the first through hole 32a may be positioned at the one side of the wiring box 30 (the upper side in FIG. 7), and at least one of the first adhesive members 42 apart from the second adhesive member 44 or the first through hole 32a may be positioned on the other side of the wiring box 30 (a lower side in FIG. 7). Accordingly, a structure of the wiring box 30 through which the conductive connecting member 122 passes can be simplified, and a heat dissipation property can be improved. According to this, at least one of the plurality of adhesive members 40 (i.e., the second adhesive member 44) may be positioned at one side of the wiring box 30 in a vertical direction of the solar cell panel 10 and at least another one of the plurality of adhesive members 40 (i.e., at least one first adhesive member 42) may be positioned on the other side of the wiring box 30 in the vertical direction of the solar cell panel 10. As a result, it is possible to prevent fixing stability of the wiring box 30 from being deteriorated due to a height difference or a distance difference or the like in the vertical direction of the solar cell panel 10. It is considered that the fixing stability may be lowered more when there is a height difference or a distance difference between the wiring box 30 and the solar cell panel 10 in the vertical direction of the solar cell panel 10 than in a horizontal direction of the solar cell panel 10.

For example, it is exemplified that a plurality of first adhesive members 42 are positioned one by one adjacent corners of the wiring box 30 and each of the first adhesive members 42 has bent shapes corresponding to shapes of corners of the wiring box 30 in FIG. 7. According to this, the air gap G can be stably formed with a uniform thickness while the wiring box 30 can be stably fixed.

Figure 8:
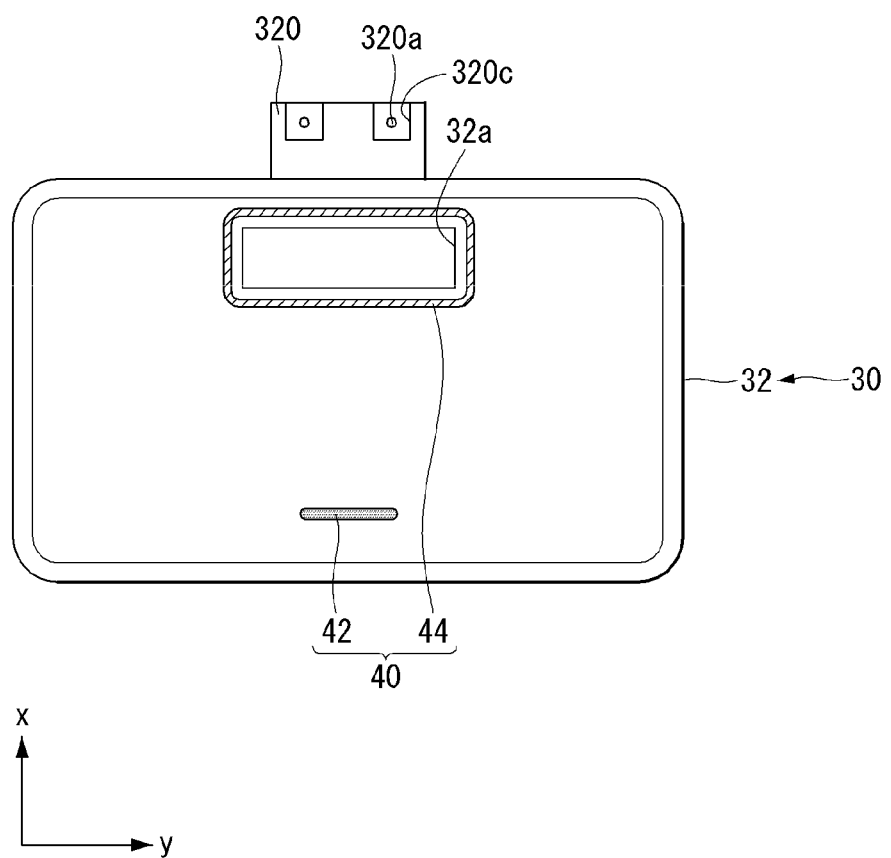
FIG. 8 is a plan view schematically showing a wiring box and an adhesive member included in a solar cell module according to a modified embodiment of the invention.
Figure 9:
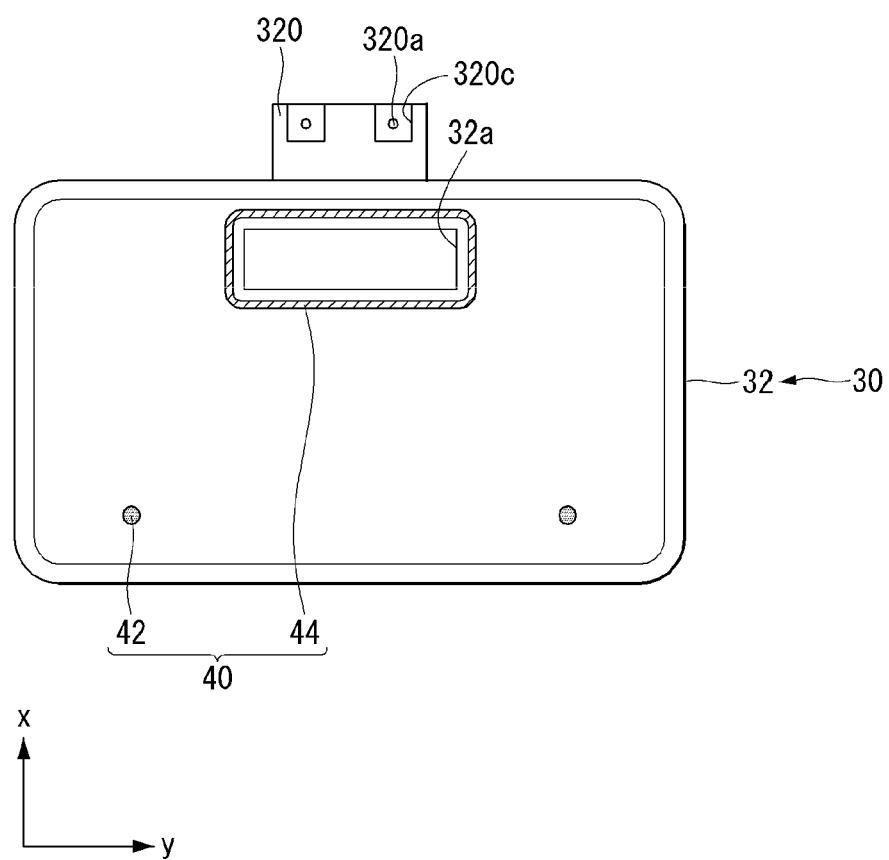
FIG. 9 is a plan view schematically showing a wiring box and an adhesive member included in a solar cell module according to another modified embodiment of the invention.
Figure 10:
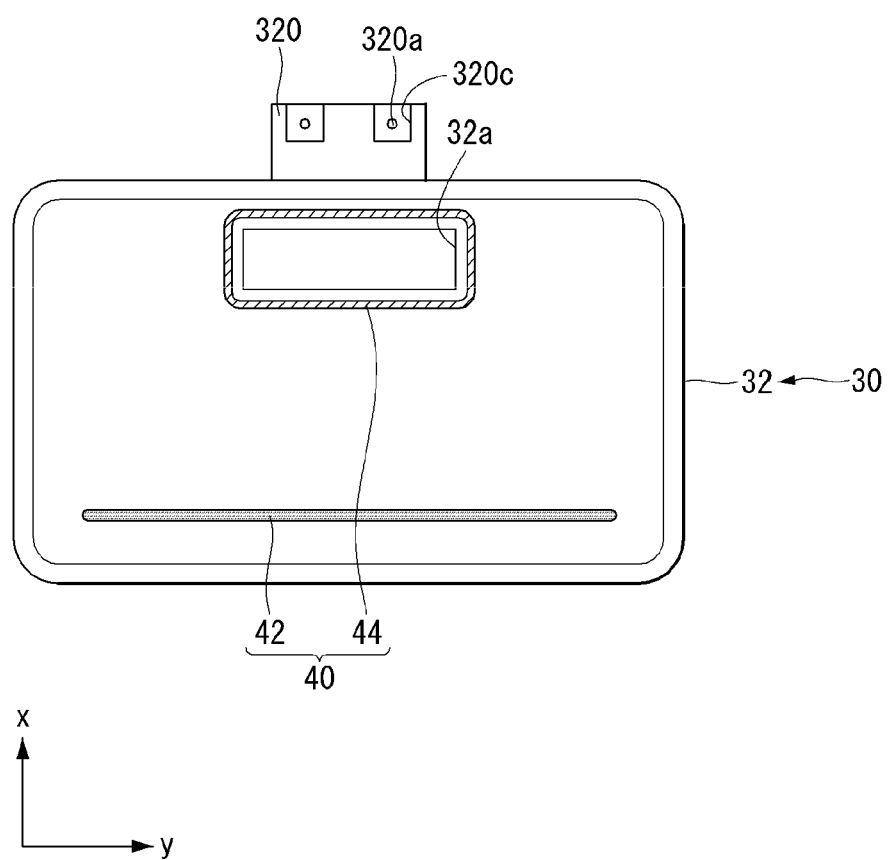
FIG. 10 is a plan view schematically showing a wiring box and an adhesive member included in a solar cell module according to still another modified embodiment of the invention.
Figure 11:
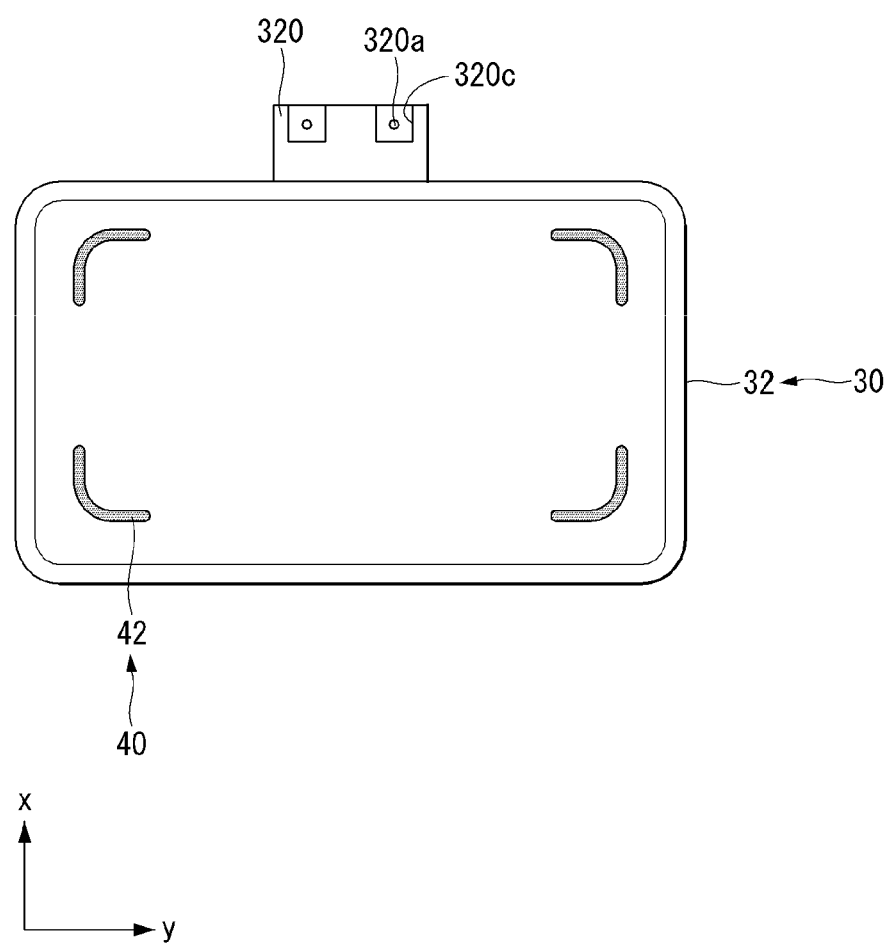
FIG. 11 is a plan view schematically showing a wiring box and an adhesive member included in a solar cell module according to yet still another modified embodiment of the invention.

However, embodiments of the invention are not limited thereto, and a shape, arrangement, and the like of the adhesive member 40 may have any of various shapes. Various modified embodiments will be described with reference to FIGS. 8 to 11. As another example, as shown in FIG. 8, only one first adhesive member 42 may be disposed at the other side and have a short length. In this instance, an area of the adhesive member 40 can be minimized to reduce a material cost while a balance between the second adhesive member 44 positioned on one side and the first adhesive member 42 positioned on the other side can be maintained. As other example, as shown in FIG. 9, first adhesive members 42 may be disposed at both lateral sides of the other side. In this instance, a material cost can be minimized while the wiring box 30 can be fixed with balance. As other example, as shown in FIG. 10, a first adhesive member 42 may be disposed at the other side and have an extended shape longitudinally extending along an edge of the other side. According to this, the wiring box 30 can be stably fixed while forming the first adhesive member 42 by one process of applying an adhesive material. As other example, as shown in FIG. 11, when a first through hole 32a is not provided, the wiring box 30 can be fixed to the solar cell panel 10 and an air gap G can be formed by a plurality of first adhesive members 42 without the second adhesive member 44. Various other variations are possible.

In the above embodiments, the first adhesive member 42 or the second adhesive member 44 has a uniform width as a whole. However, embodiments of the invention are not limited thereto. Accordingly, the first adhesive member 42 or the second adhesive member 44 may include a portion of which width is varied or a plurality of portions having different widths. Thus, by adjusting widths of the first adhesive member 42 and/or the second adhesive member 44, the air flow path AP can be formed more effectively.

In the drawings, the first adhesive members 42 and/or the second adhesive member 44 are shown to have the same or similar widths. However, embodiments of the invention are not limited thereto. The width of the second adhesive member 44 may be larger than that of the first adhesive member 42, and thus, the first through hole 32a can be stably sealed by the second adhesive member 44. Alternatively, the width of the first adhesive member 42 having the open end may be greater than that of the second adhesive member 44 that entirely surrounds the first through hole 32a, and thus, an adhesive force by the first adhesive member 42 can be enhanced and the air flow passage AP can be stably formed.

Referring to FIGS. 4 to 7, in the embodiment, the case 32 may further include a fastened part 320 to be fixed to the frame 20. The fastened part 320 is a portion of the case 30 that is coupled to the frame 20 via fastening members 38. In the embodiment, the fastened part 320 may be integrally formed with the case 32 (for example, the first case portion 32c or the second case portion 32d) to form a single body with the case 32 (for example, the first case portion 32c or the second case portion 32d) so that the fastened part 320 forms a part of the case 32. As such, the case 32 having the fastened part 320 can be formed by a simple process performed one time without a separate process, which may improve productivity.

The fastened part 320 may extend from a portion of the case 32 adjacent to the frame 20 (i.e. an upper end portion in the drawings) and come into contact with at least one surface of the frame 20 (more particularly, the second portion 244 of the frame 20). Then, when fastening holes 320a and 244a are formed at the fastened part 320 and the second portion 244 and the fastening members 38 (for example, screws or so on) are fastened through the fastening holes 320a and 244a, the case 32 can be fixed to the frame 20. Thereby, the case 32 and the frame 20 can be firmly fixed to each other via a simple structure.

In one example, in the embodiment, the fastened part 320 may include a fastened portion 322 fastened to the frame 20. In addition, the fastened part 320 may further include an extended portion 324 extended from the fastened portion 322 and connected to the case 32 (for example, the first case portion 32c). The extended portion 324 may include a first extended portion 324a, a second extended portion 324b, and a third extended portion 324c. The first extended portion 324a may be bent from the fastened portion 322 and extend toward the solar cell panel 10, the second extended portion 324b may be bent from the first extended portion 324a and extend to have a surface parallel to the solar cell panel 10, and the third extended portion 324c may be bent from the second extended portion 324b, extend backward to be connected to the first case portion 32c.

The fastened portion 322 may be positioned to come into contact (or close contact) with the second portion 244 of the frame 20. In one example, the fastened portion 322 may be positioned to come into close contact with an inner surface of the second portion 244 (i.e. a surface facing the back portion 226 or the solar cell panel 10) such that the fastened part 320 is positioned in a space inside the extension portion 24. In this instance, fastening holes 224c and 320a are formed in same or similar positions of the second portion 244 and the fastened portion 322 coming into close contact with the inner surface of the second portion 244. In addition, holding pieces 320b may be formed at lateral edges of the fastened portion 322 so as to pass through holding holes (holding grooves) 244b of the second portion 244. Then, after the fastened part 320 is set to a desired position by fitting the holding pieces 320b of the fastened portion 322 into the holding holes 244b of the second portion 244, the fastened part 320 and the second portion 244 may be fixed to each other via the fastening members 38. In the embodiment, the holding pieces 320b may include protrusions that protrude in a direction opposite to the solar cell panel 10 to pass through the second portion 244, and the holding holes 244b may be holes formed at positions corresponding to the holding pieces 320b. Thereby, positions of the fastened part 320 and the second portion 244 can be easily aligned using a simple structure. In addition, as the holding pieces 320b are formed respectively at both lateral edges of the fastened portion 322 and the two holding holes 244b are formed to correspond to the respective holding pieces 320b, alignment performance can be enhanced. However, embodiments of the invention are not limited thereto. Thus, a coupling structure of the fastened part 320 and the frame 20, and structures, shapes, positions, numbers, or the like of the holding pieces 320b and the holding holes 244b may be variously modified.

The first extended portion 324a may come into contact (or close contact) with the frame 20 (more accurately, the first portion 242). More specifically, the first extended portion 324a may come into contact (or close contact) with an inner surface of the first portion 242. As such, the fastened part 320 and the frame 20 can be more firmly fixed to each other.

The second extended portion 324b may be positioned apart from the solar cell panel 10 or the frame 20. However, embodiments of the invention are not limited thereto.

At least one through hole 320c may be formed (for example, continuously formed) in the first extended portion 324a and the second extended portion 324b to ensure easier processing of the fastened part 320 that is subjected to bending plural times. For a simple processing, a plurality of through holes 320c may be formed although embodiments of the invention are not limited thereto. In addition, shapes, sizes and the like of the through hole 320c are not greatly limited.

When the fastened part 320 is bent plural times to include the first to third extended portions 324a, 324b, and 324c as well as the fastened portion 322, the fastened part 320 can act as a reinforcement member having high strength. Thereby, a portion of the case 32 fastened to the frame 20 can have sufficient strength. In addition, when the first to third extended portions 324a, 324b, and 324c are provided, a space where one side is opened is defined by the first to third extended portions 324a, 324b, and 324c. That is, an inner space of a U shape is formed by the first to third extended portions 324a, 324b, and 324c, and thus, three surfaces of the inner space may be surrounded by the first to third extended portions 324a, 324b, and 324c and one side of the inner space between the third extended portion 324c and the fastened portion 322 (i.e., a space positioned in front of the second extended portion 324b) may be open. The inner space defined by the first to third extended portions 324a, 324b and 324c may provide a space where a trunk cable connected to an outside (for example, another solar cell module 100 or an electric grid) passes through or fixed to or the trunk cable is placed.

By further fastening the fastened part 320 to the frame 20 in the above, the wiring box 30 can be more firmly fixed. In this instance, the adhesive member 40 may be positioned at least at the other side opposite to one side where the fastened part 320 is positioned. This can improve stability. However, embodiments of the invention are not limited to this, and the case 32 may not have the fastening part 320 and thus the wiring box 30 may be not additionally fixed to the frame 20 trough the fastening part 320 or the fastening member 38.

According to the embodiment, the air gap G that is opened to the outside between the solar cell panel 10 and the wiring box 30 is formed by the adhesive member 40 that fixes the wiring box 30 to the solar cell panel 10. The heat, which is generated at the wiring box 30 by the circuit portion 34, the circuit board 348, or the like when the solar cell module 100 is operated, flows through the air flow path AP formed by the air gap G opened to the outside, thereby performing convection cooling. As a result, temperature at a portion where the wiring box 30 is positioned can be prevented from increasing due to the heat generated by the wiring box 30. Accordingly, output and efficiency of the solar cell module 100 can be prevented from being lowered due to high temperature at the portion where the wiring box 30 is positioned, and thus, output and reliability of the solar cell module 100 can be improved. In this instance, the air gap G can be formed by a simple structure using the adhesive member 40. Also, compared with the conventional case of using a separate structural member or forming a recess portion, a protruding portion, or the like at the wiring box 30, design freedom and stability can be improved, a manufacturing process can be simplified, and a manufacturing cost can be reduced.

Hereinafter, embodiments of the invention will be described in more detail with reference to experimental examples of the invention. The experimental examples of the invention are just for exemplifying the invention, but embodiments of the invention are not limited thereto.

Embodiment 1

A wiring box was attached to a solar cell panel using an adhesive member, and the adhesive member was applied so as to have an air gap opened to an outside as shown in FIG. 7.

Comparative Example 1

A wiring box was attached to a solar cell panel using an adhesive member, and the adhesive member was continuously applied along all edges of the wiring box to have a closed space inside the connected one adhesive member. Thus, an air gap opened to an outside was not formed.

Figure 12:
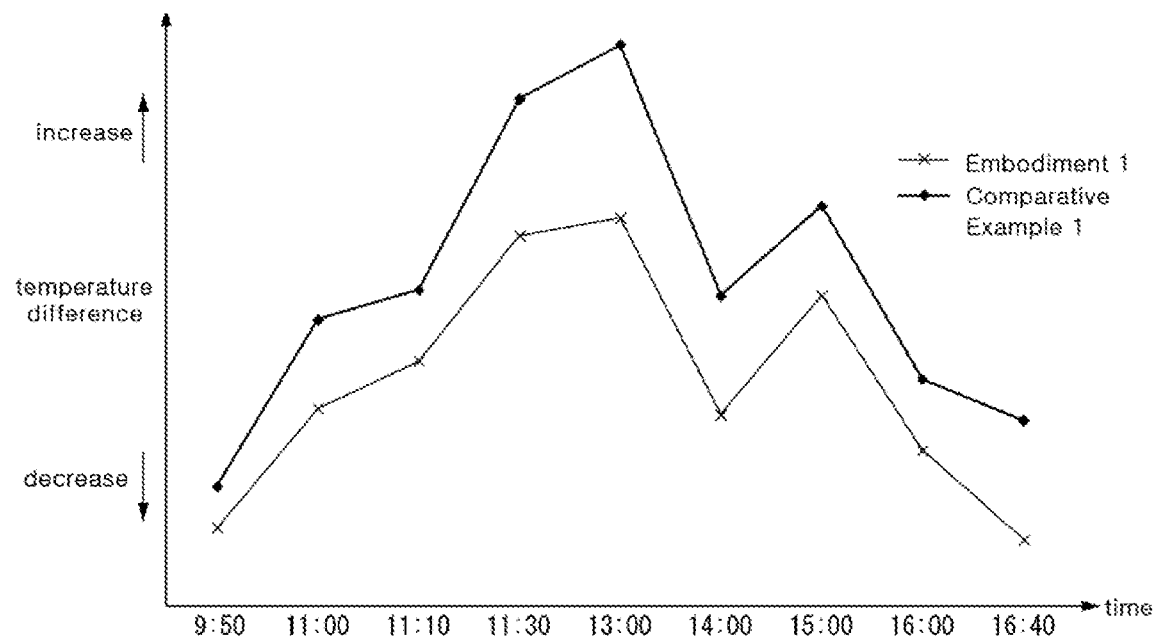
FIG. 12 is a graph showing a temperature difference between a portion where a wiring box is positioned and another portion where the wiring box is not positioned as time passes in each of solar cell modules according to Embodiment 1 and Comparative Example 1.

A temperature difference between a portion where the wiring box is positioned and another portion where the wiring box is not positioned in each of solar cell modules according to Embodiment 1 and Comparative Example 1 are measured as time passes, and the results are shown in FIG. 12.

Referring to FIG. 12, it can be seen that the temperature difference between the portion where the wiring box is positioned and another portion where the wiring box is not positioned in the solar cell module according to Embodiment 1 is very small, which is smaller than that of the solar cell module according to Comparative Example 1. From this, it can be seen that heat dissipation effect of the solar cell module according to Embodiment 1 can be enhanced by the air gap opened to the outside.

The above-described features, structures, effects, and the like are included in at least one embodiment of the invention, and are not necessarily limited to only one embodiment. Further, the features, structures, effects and the like illustrated in the embodiments may be combined and modified by persons skilled in the art to which the embodiments are pertained. Therefore, it is to be understood that embodiments of the invention are not limited to these embodiments, and various combined and modified embodiments are included in a scope of the invention.

What is claimed is:

1. A solar panel module, comprising:
   a solar cell panel;
   a wiring enclosure electrically connected to the solar cell panel and mounted on a back surface of the solar cell panel, and including a first case portion accommodating a circuit portion therein, a second case portion to seal an inner space of the first case portion, and a through hole being formed on the first case portion; and
   a first adhesive member and a second adhesive member disposed between a back surface of the first case portion and the back surface of the solar cell panel to attach the wiring enclosure to the solar cell panel,
   wherein the first adhesive member has an open end to form an air gap between the wiring enclosure and the solar cell panel, the second adhesive member having a closed space surrounding the through hole, and the second adhesive member is formed only at a periphery of the through hole and is spaced apart from the first adhesive member,
   wherein the first adhesive member is disposed between an edge area of the back surface of the first case portion and the second adhesive member,
   wherein a front surface of the wiring enclosure extends between the back surface of the solar cell panel and the circuit portion, and the front surface of the wiring enclosure is planar,
   wherein the air gap opened to an outside is provided between the solar cell panel and the wiring enclosure by the first adhesive member and has an amount of spacing corresponding to a thickness of the first adhesive member,
   wherein the first adhesive member comprises a plurality of adhesive members spaced apart from each other,
   wherein an air flow path including at least two air entrances through which air flows in or out between the solar cell panel and the wiring enclosure is formed by the plurality of adhesive members, and
   wherein the first adhesive member is arranged such that the air flow path passes through at least a portion where the circuit portion is positioned.
2. The solar cell module of claim 1, wherein the first adhesive member includes a curve or a loop between the wiring enclosure and the solar cell panel.
3. The solar cell module of claim 1, wherein a minimum width of the air flow path formed by the plurality of adhesive members is larger than the thickness of the first adhesive member.
4. The solar cell module of claim 1, wherein a width of one of the plurality of adhesive members is larger than the thickness of the first adhesive member.
5. The solar cell module of claim 1, wherein at least one of the plurality of adhesive members is positioned at one side of the wiring enclosure and at least another one of the plurality of adhesive members is positioned at the other side of the wiring enclosure.
6. The solar cell module of claim 5, wherein the at least one of the plurality of adhesive members is positioned at the one side of the wiring enclosure in a vertical direction of the solar cell module and the at least another one of the plurality of adhesive members is positioned at the other side of the wiring enclosure in the vertical direction.
7. The solar cell module of claim 1, wherein the first adhesive member has a curve and the second adhesive member spaced apart from the first adhesive member has a loop in a plan view.
8. The solar cell module of claim 7, wherein the first adhesive member is positioned adjacent to a corner of the wiring enclosure and has a bent shape corresponding to a shape of the corner.
9. The solar cell module of claim 7, wherein an end of the first adhesive member is formed of a curved portion.
10. The solar cell module of claim 7, wherein the through hole is positioned at one side of the wiring enclosure, and
    wherein the first adhesive member is disposed such that the air flow path passes through at least the other side of the wiring enclosure opposite to the one side of the wiring enclosure.
11. The solar cell module of claim 1, wherein the through hole is formed in a middle of the first case portion.
12. The solar cell module of claim 1, wherein the solar cell module further comprises a frame for fixing an outer peripheral portion of the solar cell panel, and
    wherein the wiring enclosure comprises a fastened part fixed to the frame.
13. The solar cell module of claim 12, wherein the frame and the fastened part are fixed to each other by a fastening member.
14. The solar cell module of claim 12, wherein a thickness of the wiring enclosure is smaller than a height of an extension portion of the frame.
15. The solar cell module of claim 12, wherein the fastened part is positioned at one side of the wiring enclosure, and
    wherein the first adhesive member is positioned at least at the other side of the wiring enclosure opposite to one side of the wiring enclosure.
16. The solar cell module of claim 1, wherein the first adhesive member and the second adhesive member are formed of a silicone-resin-based sealant.
17. The solar cell module of claim 1, wherein a thickness of the first adhesive member or a thickness of the air gap is about 0.1 mm to 10 mm.

* * * * *